US012794220B2

(12) United States Patent
Casey

(10) Patent No.: US 12,794,220 B2
(45) Date of Patent: Nov. 10, 2026

(54) METHOD FOR DETERMINING AN UNKNOWN RESISTANCE AND AN UNKNOWN CAPACITANCE

(71) Applicant: VoltServer Inc., East Greenwich, RI (US)

(72) Inventor: Jonathan J. Casey, Warwick, RI (US)

(73) Assignee: VoltServer Inc., East Greenwich, RI (US)

( * ) Notice: Subject to any disclaimer, the term of this patent is extended or adjusted under 35 U.S.C. 154(b) by 204 days.

(21) Appl. No.: 18/911,762

(22) Filed: Oct. 10, 2024

(65) Prior Publication Data

US 2025/0038522 A1 Jan. 30, 2025

Related U.S. Application Data

(63) Continuation of application No. 17/705,302, filed on Mar. 26, 2022, now Pat. No. 12,149,067.

(60) Provisional application No. 63/166,651, filed on Mar. 26, 2021.

(51) Int. Cl.

| | |
|---|---|
| ***H02H 7/26*** | (2006.01) |
| ***G01R 31/50*** | (2020.01) |
| ***G01R 31/58*** | (2020.01) |
| ***H02H 1/00*** | (2006.01) |

(52) U.S. Cl.
CPC ............... *H02H 7/26* (2013.01); *G01R 31/50* (2020.01); *G01R 31/58* (2020.01); *H02H 1/0007* (2013.01)

(58) Field of Classification Search
CPC ........ H02H 7/26; H02H 1/0007; H02H 3/207; H02H 3/006; H02H 5/12; G01R 31/50; G01R 31/58
See application file for complete search history.

(56) References Cited

U.S. PATENT DOCUMENTS

| | | | |
|---|---|---|---|
| 3,558,830 | A | 1/1971 | Bender et al. |
| 8,068,937 | B2 | 11/2011 | Eaves |
| 8,781,637 | B2 | 7/2014 | Eaves |
| 9,184,795 | B2 | 11/2015 | Eaves |
| 9,419,436 | B2 | 8/2016 | Eaves et al. |
| 9,853,689 | B2 | 12/2017 | Eaves |
| 9,893,521 | B2 | 2/2018 | Lowe et al. |
| 10,714,930 | B1 | 7/2020 | Weiss et al. |
| 11,063,630 | B2 | 7/2021 | Arduini et al. |
| 11,916,374 | B2 | 2/2024 | Potterf |
| 11,990,952 | B2 | 5/2024 | Arduini et al. |
| 2010/0320986 | A1 | 12/2010 | Collins |
| 2014/0091946 | A1 | 4/2014 | Ramirez |
| 2016/0094085 | A1 | 3/2016 | Janardhan |
| 2016/0294500 | A1 | 10/2016 | Chawgo |
| 2017/0229886 | A1 | 8/2017 | Eaves |

(Continued)

*Primary Examiner* — Crystal L Hammond
*Assistant Examiner* — Samantha L Faubert
(74) *Attorney, Agent, or Firm* — Modern Times Legal; Robert J. Sayre

(57) ABSTRACT

An unknown resistance and an unknown capacitance are calculated. Both are connected across output terminals of a transmitter. During a first sample period, values indicative of a first rate of voltage decay in a transmission line without a known bias applied are obtained. Additionally, during the first sample period or during a second sample period, values indicative of a second rate of voltage decay with a known bias applied are obtained. The unknown resistance and the unknown capacitance are calculated using the first rate of voltage decay, the second rate of voltage decay, and the known bias, wherein the known bias is a single known bias.

15 Claims, 4 Drawing Sheets

(56) References Cited

U.S. PATENT DOCUMENTS

| | | | |
|---|---|---|---|
| 2018/0313886 A1 | 11/2018 | Mlyniec et al. |
| 2022/0311240 A1 | 9/2022 | Casey |
| 2023/0223988 A1 | 7/2023 | Arduini et al. |
| 2024/0380432 A1 | 11/2024 | Arduini et al. |

METHOD FOR DETERMINING AN UNKNOWN RESISTANCE AND AN UNKNOWN CAPACITANCE

RELATED APPLICATIONS

This application is a continuation of U.S. application Ser. No. 17/705,302, filed 26 Mar. 2022, the entire contents of which are incorporated herein by reference. This application also claims the benefit of U.S. Provisional Application No. 63/166,651.

FIELD OF THE INVENTION

This invention relates to power-distribution-system safety-protection devices—for example, power-distribution systems with electronic monitoring to detect and disconnect power in the event of an electrical fault or safety hazard, particularly where an individual has come in contact with exposed conductors. This invention is applicable to general power distribution and, in particular exemplifications, to, e.g., electric vehicle charging, telecommunications or alternative energy power systems.

BACKGROUND

The discussion of the background state of the art, below, may reflect hindsight gained from the disclosed invention(s); and these characterizations are not necessarily admitted to be prior art.

Digital electric power, or digital electricity, can be characterized as any power format where electrical power is distributed in discrete, controllable units of energy. Packet energy transfer (PET) is a new type of digital electric power protocol disclosed in U.S. Pat. No. 8,068,937 B2 (Eaves '937), U.S. Pat. No. 8,781,637 B2 (Eaves '637), and published international patent application WO 2017/139289 A1Eaves '289.

The primary discerning factor in a digital-power-transmission system compared to traditional, analog-power systems is that the electrical energy is separated into discrete units; and individual units of energy can be associated with analog and/or digital information that can be used for the purposes of optimizing safety, efficiency, resiliency, control or routing. Since the energy in a PET system is transferred as discrete quantities, or quanta, it can be referred to as "digital power" or "digital electricity".

As described in Eaves '637, a source controller and a load controller are connected by power-transmission lines. The source controller of Eaves '637 periodically isolates (disconnects) the power-transmission lines from the power source and analyzes, at a minimum, the voltage characteristics present at the source-controller terminals directly before and after the lines are isolated. The time period when the power lines are isolated was referred to by Eaves '637 as the "sample period", and the time period when the source is connected is referred to as the "transfer period". The rate of rise and decay of the voltage on the lines before, during and after the sample period reveal if a fault condition is present on the power-transmission lines. Measurable faults include, but are not limited to, short circuit, high line resistance or the presence of an individual who has improperly come in contact with the lines.

Eaves '637 also describes digital information that may be sent between the source and load controllers over the power-transmission lines to further enhance safety or provide general characteristics of the energy transfer, such as total energy or the voltage at the load-controller terminals. One method for communications on the same digital-power-transmission lines as used for power was further described and refined in U.S. Pat. No. 9,184,795 B2 (Eaves '795).

One application of a digital-power-distribution system is to safely distribute direct-current (DC) power in digital format and at elevated voltage from the source side of the system to the load side.

U.S. Pat. No. 9,853,689 B2 (Eaves '689) describes the packaging of the source-side components of Eaves '637, in various configurations, into a device referred to as a digital-power transmitter.

U.S. Pat. No. 9,419,436 B2 (Eaves '436) describes the packaging of various configurations of the load-side components of Eaves '637 into a device referred to as a digital-power receiver.

U.S. Pat. No. 9,893,521 B2 (Lowe '521) introduced the concept of multiple sources of power and multiple loads connected together safely in a digital-power network using Packet Energy Transfer. The concept of a power-control element (PCE) was introduced in Lowe 2014 as a primary component in a digital-power network.

US Pub. Pat. App. No. 2018/0313886 A1 (Mlyniec '886) describes methods for verifying digital-electricity-line integrity, which includes applying a bias to the transmission line during the sample period, synchronizing the start times of respective sample periods on first and second transmission lines, among other methods.

U.S. Pat. No. 10,714,930 B1 (Weiss '930) describes the usage of carrier-wave detection to measure the impedance of a transmission line in a power-distribution system.

SUMMARY

A method and apparatus for determining an unknown resistance and an unknown capacitance and for automatically configuring a set of operating parameters for packet-energy transfer are described herein, where various embodiments of the apparatus and methods may include some or all of the elements, features and steps described below.

Described herein is a method for determining an unknown resistance and an unknown capacitance, both of which are connected across output terminals of a transmitter. During a first sample period, values indicative of a first rate of voltage decay in a transmission line without a known bias applied are obtained. Additionally, during the first sample period or during a second sample period, values indicative of a second rate of voltage decay with a single known bias applied are obtained. The unknown resistance and the unknown capacitance are calculated using the first rate of voltage decay, the second rate of voltage decay, and the single known bias.

A digital-electricity power system includes a transmitter configured to receive electrical power from a power source, a receiver configured to receive the electrical power from the transmitter, transmission lines electrically coupling the transmitter and the receiver to transmit the electrical power between the transmitter and the receiver, a measurement apparatus configured to measure voltages in the digital electricity power system, a single known bias source configured to supply an electrical bias to the transmission lines, and at least one controller. The controller is configured to control the application of the electrical bias to the transmission lines and to receive values indicative of a first rate of voltage decay in the transmission lines without the electrical bias applied to the transmission lines as well as values indicative of a second rate of voltage decay in the transmission lines with the electrical bias applied to the transmission lines. Further, the controller is programmed to calculate unknown resistance and unknown capacitance using the first rate of voltage decay, the second rate of voltage decay; and the electrical bias applied by the known bias source.

The methods described below build on the earlier work of Eaves '637 and Mlyniec '886 by, e.g., focusing on novel methods to automatically maximize the range of operation in the context of digital-electricity fault detection without compromising on shock and fire safety. Several variables may exist in a digital-electricity system, such as how much line-to-line capacitance is present in a transmission line, which present a challenge in terms of obtaining or performing accurate measurements, control, and limit evaluation when static methods are used.

Digital electric power, or digital electricity, can be characterized as any power format where electrical power is distributed in discrete, controllable units of energy. A digital-electricity system periodically isolates an electrical transmission line from both the source and load to analyze analog line characteristics that reflect a possible fault or human contact with the transmission wiring. The detection of line faults involves periodic measurement of transmission-line voltage, current, or both. As system parameters change, such as the distance between the source and the load, these measurements, techniques, and limits are adapted in order to maximize performance capabilities while still ensuring safe operation at all times. The disclosed methods can be used to meet the adaptive requirements through automatic ranging of measurement apparatus and the limits applied to these measurements to maximize performance without compromising safety.

Described herein are methods for automatic ranging of limits and measurement apparatus applied to measurements used in determining transmission-line faults while executing packet energy transfer. Various embodiments of the methods and apparatus for performing the method may include some or all of the elements, features, and steps described below.

In a first method, an initial set of limits for packet energy transfer operation are configured, and upon a limit being exceeded, the transmission lines are de-energized (packet energy transfer ceases, and power to the transmission lines is interrupted), and a new set of limits is automatically configured based on which limit was exceeded. After the limits are configured, and transmission-line power is restored, the process is repeated until a suitable set of limits is found without compromising the safe operation requirement of preventing human shock and electrical fire risk.

In a second method, an initial set of limits for operation is configured, and packet energy transfer operation continues until one or more limits are exceeded, whereupon one or more limits are reconfigured without interrupting power to the transmission line. The process of reconfiguring limits while still operating is repeated until a suitable configuration is determined or until a maximum time period that ensures safe operation is exceeded, at which time, power to the transmission line is interrupted.

In a third method, an initial set of operating parameters is configured, and upon a limit being exceeded, a revised set of operating parameters is automatically configured in an always-safe sequence. This reconfiguration of operating parameters may occur after operation has ceased due to the limit being exceeded or may occur while still operating. This may or may not require new limits to also be configured.

The concept of an always-safe item is used herein to refer to something designed to meet a chosen standard of safety under all reasonable operating conditions at all times. For example, if a designer has chosen the definition of safety to be avoiding ventricular fibrillation (VF) by staying below the threshold of the DC-4 region of IEC 60479-1, then an item would be always-safe if, and only if, the DC-4 region is never exceeded under all reasonable operating conditions. Reference to all reasonable operating conditions is used herein to reference conditions that exclude probabilistically unlikely events, such as unforeseeable acts of nature, extreme catastrophic-failure modes, and other events. IEC 61508 provides some guidance, for example, as to events to be considered when evaluating operating conditions. "Always" is used as an extremely high probability of success, where the probability's conditions of evaluation and its acceptable threshold are also defined by a chosen standard of safety. It is typical for a safety standard, such as IEC 62368-1, to impose failures into the apparatus under test and to evaluate if the apparatus still maintains a predetermined level of safety.

As taught in Mlyniec '886, measuring with the bias, in combination with the measurement without the bias, can be practiced to calculate an effective line-to-line impedance, where this impedance includes at least a parallel resistor and capacitor connected to the source-controller positive output 16 and source-controller negative output 23, particularly when ringing has subsided and the voltage difference between the source controller and the load controller is negligible. Limits can be applied directly to these calculated impedance values. These values can be updated with the most recently acquired measurement to use the most up-to-date values at all times.

The disclosed methods expand upon existing techniques available to the public where reconfiguration of measurement, technique, limits, or any combination thereof can be performed through non-automatic means. For example, these non-automatic means can include a person manually reconfiguring the installation and/or use of different physical devices that obtain/perform/implement these different measurements, techniques, limits, or any combination thereof. In a similar example, these non-automatic means can include a software command that is sent by a person in order to reconfigure these measurements, techniques, limits, or any combination thereof. By now employing automatic means for effecting these reconfigurations through these disclosed methods, significant improvements to operation can be realized.

High line-to-line capacitance can shroud the effects of a decrease in line-to-line resistance, as taught in Mlyniec '886. This high capacitance can present in several ways within correct system configurations as well as through misconfigurations. As one example, it is known within transmission-line theory that within a cable, two conductors have a mutual capacitance. This capacitance is often expressed on a per-unit-length basis (for example, in picofarads per foot). As the length of a given cable increases, the total capacitance increases. Exceeding these line-to-line decay limits suggests to the source controller that there may be more or less capacitance than previously considered, and the source controller can conclude that this divergence may be due to the length of the cable being longer or shorter.

In another example, multiple receivers may be connected to the same transmitter in a PET system, as described in Lowe '521. Since each of these receivers contains more capacitance, as depicted in FIG. 1, as capacitor ($C_2$) 9, these receivers can add in parallel to produce a larger capacitance. Configuring the system to work at these higher line-to-line capacitances may not enable ideal operation at lower capacitance levels for least the reasons that biasing may be too strong, or measurements and limits may be too sensitive.

The disclosed methods can be used to overcome these effects of high line-to-line capacitance, whether it be from transmission lines, multiple receivers, or any other means, to allow operation across the range of possible configurations without user intervention.

In summary, the range of operation for safe power distribution in a digital electricity power system in the context of fault detection can be automatically maximized without compromising on human shock safety nor on electrical fire safety. Automatic ranging can be accomplished in a number of ways, such as reconfiguring measurement apparatus, using different techniques, configuring different sets of limits based on previous measurements, and dynamically calculating new limits based on previous measurements without necessarily needing to cease operation.

In additional methods, at least three measurements of transmission-line voltage are acquired during the sample period, where voltage measurements may be affected by electrical disturbances. Numerical analysis is performed on the measurements to produce a polynomial function that approximates disturbance-free transmission-line voltage measurements.

Additionally, the integrity of the transmission-line voltage measurements in the presence of line-voltage disturbances during the sample period is further ensured by acquiring at least three measurements of transmission-line voltage during the sample period where voltage measurements may be affected by electrical disturbances, performing numerical analysis on the voltage measurements to produce a polynomial function that approximates disturbance-free transmission-line voltage measurements, estimating accuracy of the polynomial function based on magnitude of variance of the individual voltage measurements from the approximation, and interrupting the transmission of digital-electricity power over the transmission line if the estimated accuracy does not meet a minimum accuracy requirement.

Figure 1:
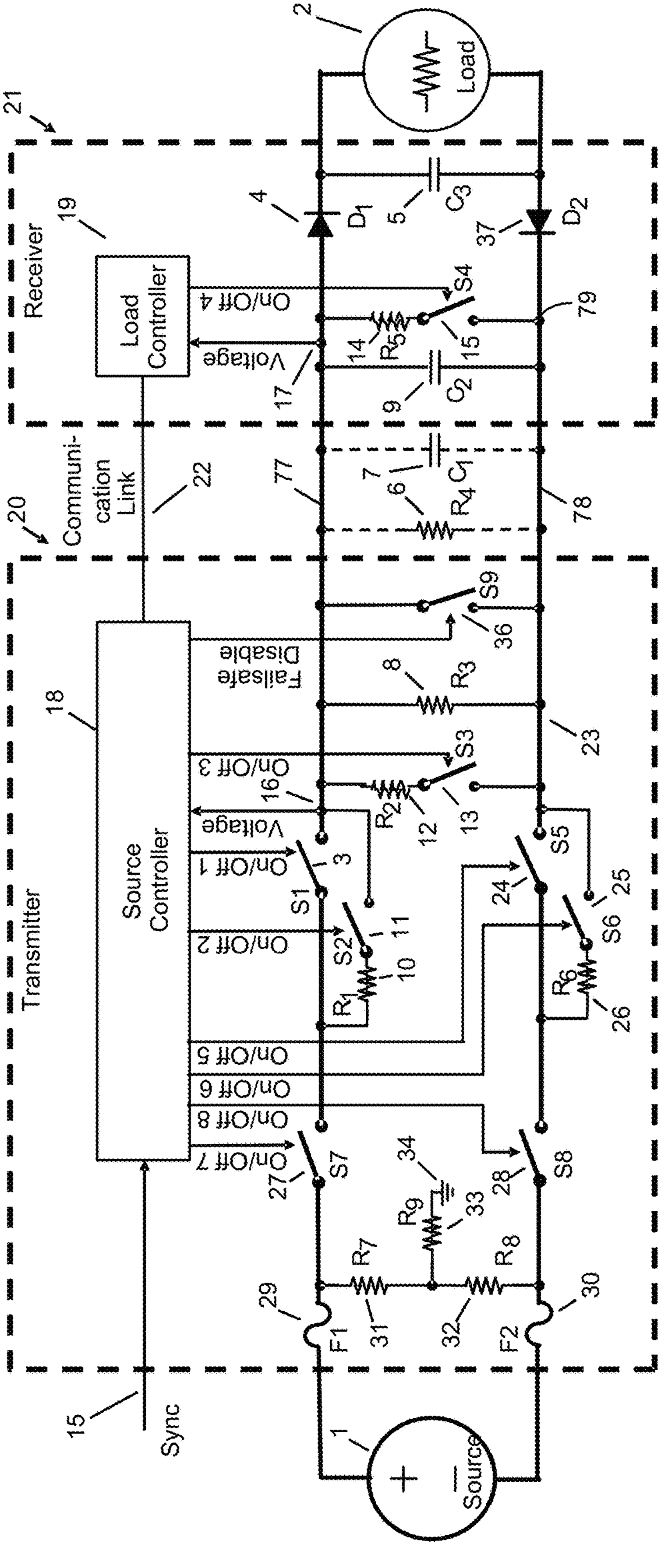
FIG. 1 is a block diagram of an embodiment of the digital-electricity system.

In the accompanying drawings, like reference characters refer to the same or similar parts throughout the different views. The drawings are not necessarily to scale; instead, an emphasis is placed upon illustrating particular principles in the exemplifications discussed below. For any drawings that include text (words, reference characters, and/or numbers), alternative versions of the drawings without the text are to be understood as being part of this disclosure; and formal replacement drawings without such text may be substituted therefor.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, used, or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein.

In this disclosure, when an element is referred to as being "on," "connected to," "coupled to," "in contact with," etc., another element, it may be directly on, connected to, coupled to, or in contact with the other element or intervening elements may be present unless otherwise specified.

Some of the terminology used herein is associated with particular embodiments and is not intended to limit more generic exemplifications of the invention. As used herein, singular forms, such as "a" and "an," are intended to include the plural forms as well, unless the context indicates otherwise. Additionally, the terms "includes," "including," "comprises," and "comprising" specify the presence of the stated elements or steps but do not preclude the presence or additional of one or more other elements or steps.

A representative digital-power system, as originally described in Eaves '637 and in Mlyniec '886, is shown in FIG. 1. The system comprises a source 1 and at least one load 2. The PET protocol is initiated by an operating switch (S1) 3 and switch (S5) 24 to periodically disconnect the source 1 from the power transmission lines 77 and 78. When the switches are in an open (non-conducting) state, the lines are also isolated by isolation diode ($D_1$) 4 and diode ($D_2$) 37 from any stored energy that may reside at the load 2. In other embodiments, a single switch can be opened and closed and/or a single diode can be isolated when practicing the methods described herein. Further, as an alternative to the use of one or more diodes, one or more controllable bi-directional or uni-directional solid state switches can be used.

Eaves '637 offered several versions of alternative switches that can replace $D_1$ and $D_2$, and all versions can produce similar results when used in the presently described methods. Capacitor ($C_3$) 5 is representative of an energy-storage element on the load side of the circuit.

The transmission lines 77 and 78 have inherent line-to-line (or cross-line) resistance ($R_4$) 6 and capacitance ($C_1$) 7. The PET system architecture, as described by Eaves '637, adds additional line-to-line resistance ($R_3$) 8 and capacitance ($C_2$) 9. At the instance that the switch 3 is opened, $C_1$ and $C_2$ have stored charge that decays at a rate that is inversely proportional to the additive values of $R_4$ and $R_3$. Capacitor ($C_3$) 5 does not discharge through the resistances $R_3$ and $R_4$ due to the reverse-blocking action of the isolation diode ($D_1$) 4. The amount of charge contained in the capacitors ($C_1$ and $C_2$) is proportional to the voltage across them and can be measured at the source-controller positive output 16 with respect to the source-controller negative output 23 by a source controller 18, and at the load-controller positive input 17 with respect to the load-controller negative input 79 by a load controller 19.

Figure 2:
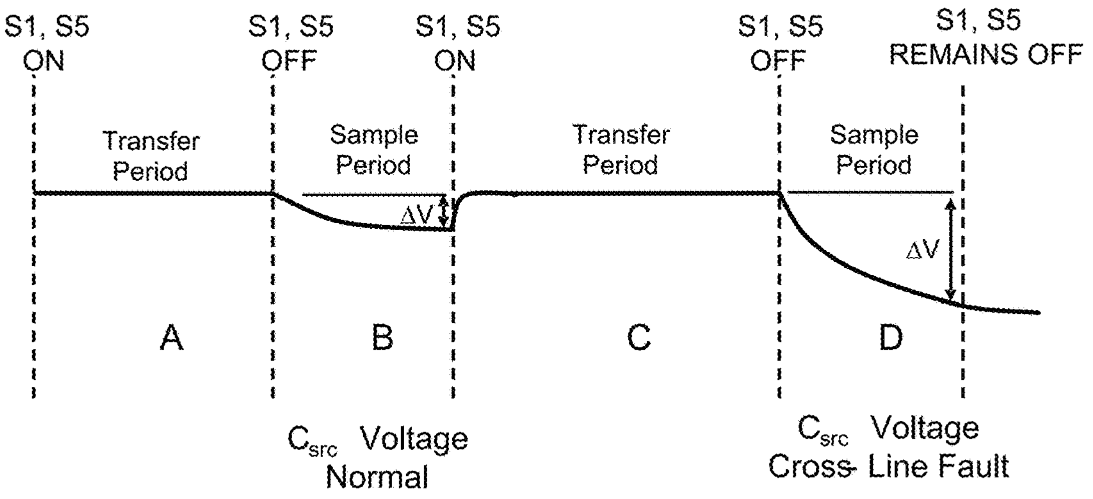
FIG. 2 is an illustration of a PET voltage waveform.

As described in Eaves '637, a change in the rate of decay of the energy stored in $C_1$ and $C_2$ can indicate that there is a cross-line fault on the transmission lines 77 and 78. The difference between normal operation and a fault, as presented by Eaves '637, is illustrated in FIG. 2.

Additional elements common to the art are incorporated into the system. The source controller 18 uses switch (S7) 27 and switch (S8) 28 as secondary protection to allow disconnection in the event of a single component failure, such as switch (S1) 3 failing with an electrical short. These secondary switches S7 and S8 are typically left closed once operation begins unless there is a fault. The following pre-charge circuit components: resistor ($R_1$) 10, resistor ($R_6$) 26, switch (S2) 11, and switch (S6) 25, allow current-limited soft-start capabilities. Current-limited earth-ground balance is provided by resistor ($R_7$) 31, resistor ($R_8$) 32, and resistor ($R_9$) 33. These high-resistance values center-tie the earth ground 34 with respect to the high-voltage source terminals by using matching impedance values for $R_7$ and $R_8$ while current-limiting any earth-ground fault current through $R_9$.

Further failsafe protection is also present. Switch (S9) 36 provides a failsafe crowbar circuit that is actively disabled by the source controller 18 or by any other monitoring "watchdog" element as described in Eaves '637 pertaining to a disconnect. Fuse (F1) 29 and fuse (F2) 30 are standard circuit-protection elements; and, in combination with the crowbar switch (S9) 36, provide a way to disconnect the source in the event of a failure of the primary switches 3 and 24 along with the secondary switches 27 and 28 and an inability to command the source 1 to turn off.

The bias circuit that includes the resistor ($R_2$) 12 and switch (S3) 13 allows line integrity to be verified, as taught in Mlyniec '886. This bias circuit along with the other bias circuit that includes resistor ($R_5$) 14 and switch (S4) 15 are used for in-line communication between the source controller 18 and the load controller 19, as taught in the Eaves Communication Patent. Communication between the source controller 18 and the load controller 19 using a separate copper or fiber-optic communication line is depicted by communication link 22. The sync signal 15 is used for time synchronization of multiple source controllers as additional means to improve line integrity, as taught in Mlyniec '886.

Referring again to FIG. 1, the combination of a source disconnect device, here in the form of switch (S1) 3; source controller 18; resistor ($R_1$) 10; switch (S2) 11; resistor ($R_3$) 8; resistor ($R_2$) 12; switch (S3) 13; switch (S5) 24; switch (S6) 25; resistor ($R_6$) 26; switch (S7) 27; switch (S8) 28; fuse (F1) 29; fuse (F2) 30; resistor ($R_7$) 31; resistor ($R_8$) 32; resistor ($R_9$) 33; and switch (S9) 36 can be referred to as a transmitter 20. The combination of switch (S4) 15; resistor ($R_5$) 14; load controller 19; diode ($D_1$) 4; capacitor ($C_2$) 9; capacitor ($C_3$) 5; and diode ($D_2$) 37 can be referred to as a receiver 21.

In a first method, the rate of voltage decay during the sample period is checked to evaluate whether it occurred too quickly or too slowly, as taught in Eaves '637. The rate of voltage decay during the sample period with the bias applied is compared to predetermined maximum and predetermined minimum values, as taught in Mlyniec '886. Based on the outcome of these two operations, the source controller 18 can conclude that the amount of line-to-line capacitance may be larger or smaller than it previously considered depending on whether the predetermined minimum or predetermined maximum is exceeded. In the event that the source controller 18 concludes the line-to-line capacitance may be larger or smaller than previously anticipated, the source controller 18 can perform actions to allow more optimized operation.

The source controller 18 can perform actions to allow more optimized operation in several ways. The source controller 18 can configure a different set of predetermined minimum and predetermined maximum values that are optimized for ensuring that a minimum line-to-line resistance fault is always detected within this new distance range. The source controller 18 can reconfigure the amount of bias applied so that it counteracts the effects of capacitance more appropriately, whether this bias be resistance values, current sources or sinks, or any other means of providing a bias. The source controller 18 can alter the off time by reconfiguring the duty cycle, the period, or both in order to be able to optimally measure the next anticipated amount of capacitance. The source controller 18 can use different sensors, filters, gains, bias offsets, AC coupling, ADC resolution, and other known techniques for maximizing signal quality by means of hardware reconfiguration, firmware reconfiguration, or both in order to achieve optimal measurements in the next anticipated capacitance range.

For example, the source controller 18 would measure the voltage at point 16 with respect to the source-controller negative output 23 by using a circuit designed for the purpose of sensing the voltage. In designing a circuit to be used as a voltage sensor, the input signal level, desired output signal, expected signal-to-noise ratio, and other constraints are considered when configuring hardware components. If the input signal is expected to have a small range of voltage levels, it can be designed with a gain that maximizes the output signal-to-noise ratio. This circuit with this configured gain value would not work when the input signal range became larger. If the circuit is designed to support this larger input signal range, the signal-to-noise ratio when the input signal range is small will be poor and can result in erroneous measurements. Thus, if multiple voltage sensor circuits are implemented to address different expected ranges of operation, the source controller 18 can decide the optimal sensor to use based on which limit has been exceeded.

In another example, transmitter 20 can use known hardware or software filtering implementations to improve signal-to-noise ratio. When using filters, there is a possibility that part of the signal is altered to the extent that it results in erroneous conclusions. For example, a low-pass filter that only allows frequencies below 60 Hz will be successful at providing an improved signal-to-noise ratio when there is noise at 120 Hz, but this low-pass filter would be unacceptable if the desired signal is expected to have a frequency of 240 Hz because this frequency would also be reduced by the filter. One way the transmitter 20 can implement a filter is on the input or the output of the voltage sensor. For example, the source controller 18 can start operation with no filter or with a filter that allows a significant part of the signal's frequency content. Based on the limits that can be exceeded due to poor signal integrity, the source controller 18 can configure a filter that targets the identified noise without affecting the desired signal. This filter implementation can also be implemented in software instead using known techniques.

In another example, the source controller 18 can configure different analog-to-digital-converter (ADC) parameters for optimization. ADC circuits can be configured in many ways, including at least configuring a speed, a resolution, and a topology. Increased speed allows more samples to be taken in the same amount of time, but this increase in speed can result in increased noise and less resolution. An increased resolution allows smaller changes in a signal to be distinguished, but this increase in resolution can result in more noise and error as well as be slower. For example, when designed to support a maximum signal of 2.56 V, an ADC can detect changes as small as 0.01 V with an 8-bit resolution, but with a 10-bit resolution, this ADC can detect changes as small as 0.0025 V. This 10-bit resolution is typically slower and has more noise compared to an equivalent 8-bit resolution. There are different topologies for ADCs, such as Sigma-Delta and Successive Approximation Register (SAR), that only support certain combinations of speed and resolution. Thus, as different speeds and resolutions are targeted, these targets can require a different ADC topology. For example, the source controller 18 can prefer to use a fast ADC speed, low resolution, SAR topology to start operation. When a limit is exceeded that is indicative of poor signal integrity in the form of poor resolution, the source controller 18 can configure a higher resolution that requires a slower speed and a Sigma-Delta topology instead for subsequent measurements.

The source controller 18 can make other reconfigurations specific to the PET algorithm described in Eaves '637 and Mlyniec '886, such as configuring a different subset of samples to use for analysis by reconfiguring the timing of the first sample used for line-integrity and sample-period evaluation; reconfiguring the number of samples used for line-integrity evaluations; reconfiguring the length of the off-time to allow more or fewer samples to be collected by reconfiguring the period, duty cycle, or both. For example, the timing of the first sample used for assessing line integrity can be set at a greater time from the start of the sample period in order to avoid unsettled portions of the waveform due to the effects of switching. This first sample is further constrained by wanting to allow as much time as practical for sampling data for a line-integrity evaluation to provide the most statistically significant results. For example, sampling can start as close as possible to the start of the sample period. Configuring the timing of this first sample based on the behavior of the system in the intended applications is, therefore, a design choice. In the event the period is reconfigured, reconfiguration of the synchronization signal 15 may be required. If the same or different fault occurs in subsequent attempts, the source controller 18 can repeat these procedures up to the limitations of its implemented hardware and firmware.

One detailed example of these actions that the source controller 18 can perform to optimize the control and measurement involves reconfiguring the bias level. One example of an implementation of this bias is shown in FIG. 1 in the form of the resistance ($R_2$) 12 and switch (S3) 13. This pair of components can be duplicated and connected to the transmission lines 77 and 78 in parallel with $R_2$ 12 and $S_2$ 13 between the source-controller positive output 16 and source-controller negative output 23. With independent control of these switches (S3) 13, different bias levels can be applied. In this example, there would be three bias levels and one unbiased level depending on the combination of switches (S3) 13 being open or closed. When the source controller 18 detects a limit being exceeded, a different bias level is configured that will allow more optimal measurement accuracy. For example, if a limit is exceeded due to a voltage change or a voltage slope being too small, a lower resistance bias can be used in a subsequent measurement to create a better signal-to-noise ratio and thereby improve accuracy. Depending on how the limits are defined, this reconfiguration may require the limits to be adjusted to factor in the new bias level being used.

In another example, where the source controller 18 can optimize the factors of safety, efficiency and resiliency, the sample period duration is reconfigured. In this example, when the source controller 18 detects a limit being exceeded, a different sample period duration can be used for the subsequent sample period. For example, if a limit is exceeded due to a voltage change or a voltage slope being too small, a longer sample period can be used for the next sample period to increase the signal-to-noise ratio and thereby increase the accuracy of the measurement. Depending on how the limits are defined, this reconfiguration may require the limits to be adjusted to factor in the new time duration.

In both of the above detailed examples that include reconfiguring the bias level and reconfiguring the length of the sample period, there are reasons that the most extreme bias levels and the longest sample periods are not desirable to use at all times. In the case of reconfiguring the bias level, lower efficiencies may result from the need to charge and discharge the transmission-line capacitance to and from the configured bias level. In the case of the sample period, longer sample periods may require larger and more expensive capacitors to maintain supplying the voltage to the load during the sample period. In both cases, larger current transients that may result when turning back on from a lower voltage may result in electromagnetic compatibility challenges that create too much noise and interfere with the proper operation of the source controller 18 or the load controller 19 or other external devices.

Figure 3:
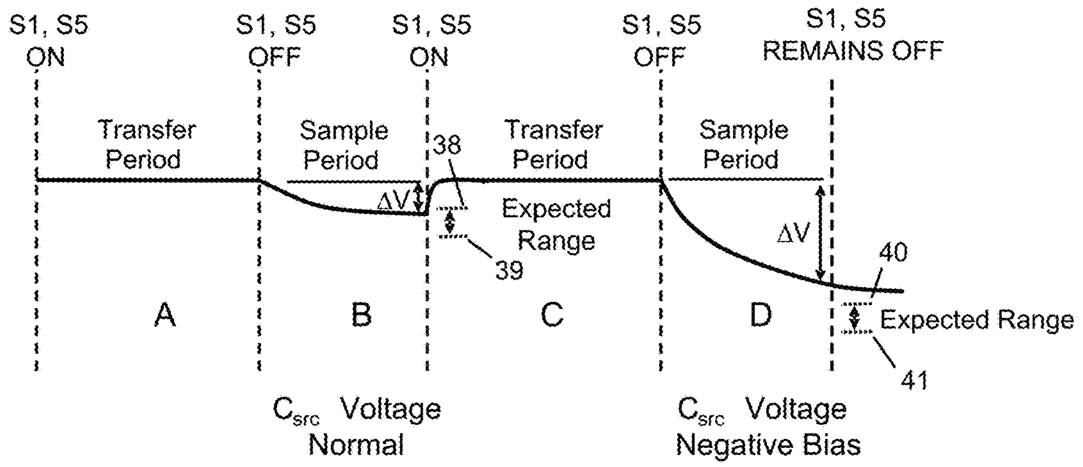
FIG. 3 illustrates PET waveforms where operation ceases when a measurement is outside of the expected range.

FIG. 3 shows an example of switching between sets of limits, as described by this first method, where, in this example, it shows an initial attempt with the incorrect voltage limits configured. In the first sample period B, the final voltage of the decay is compared against an expected range between upper voltage limit 38 and lower voltage limit 39. These limits may be either absolute limits or they may be relative to a point sampled earlier in the sample period, but the absolute limits or relative amounts would be decided prior to transfer period A. In this example, the final voltage of sample period B falls within the voltage limit 38 and 39, which permits switch (S1) 3 and switch (S5) 24 to turn back on and continue operation.

During sample period D in FIG. 3, a negative bias is applied. A set including an upper voltage limit 40 and lower voltage limit 41 that are different from those used in sample period B is used. These limits are also either absolute limits or relative to a point prior in the sample period, and the limits would be decided prior to transfer period A. In this example, the final voltage of the sample period D falls outside of the expected range. This suggests either that there is a fault or that a different set of limits must be chosen. As a result, switch (S1) 3 and switch (S5) 24 remain off, and the source controller 18 configures a new set of limits to use after the next startup is initiated. In this case, because the final voltage was above the upper voltage limit 40, the source controller 18 concludes that there may be more line-to-line capacitance, less line-to-line resistance, or both than previously anticipated. The source controller 18 then configures higher limits for both the normal and the negatively biased sample periods B and D, respectively.

Figure 4:
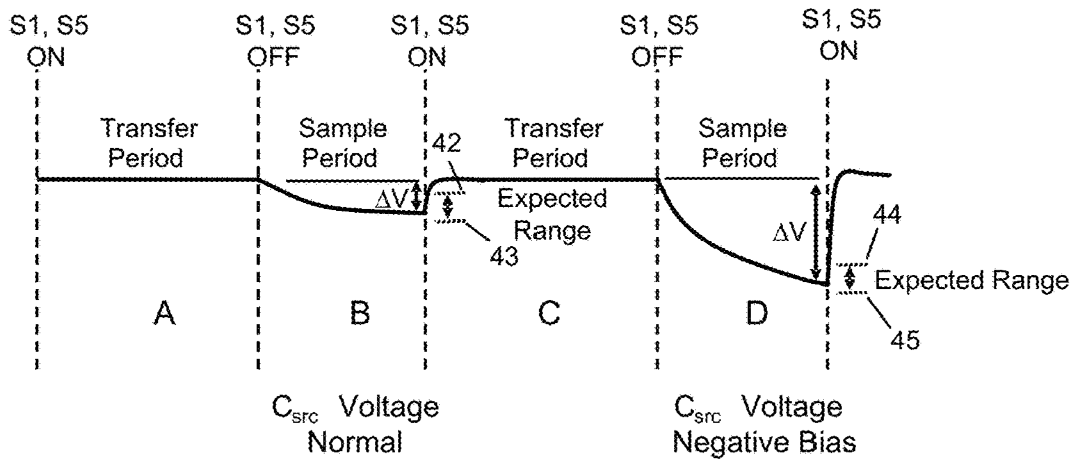
FIG. 4 illustrates PET waveforms where operation can resume without error using a different set of limits than in FIG. 3.

FIG. 4 shows such a subsequent attempt after the conclusion of the attempt portrayed in FIG. 3. In FIG. 4, the same signal is shown, but all voltage limits 42-45 have been raised relative to their respective limits 38-41 from FIG. 3. Sample period B in FIG. 4 shows the final voltage still falling within the expected range between the upper voltage limit 42 and the lower voltage limit 43, although the final voltage is now closer to the lower voltage limit 43 than it was previously in FIG. 3 with the lower voltage limit 39. Sample period D in FIG. 4 shows that the final voltage falls within the new expected range given by the upper voltage limit 44 and the lower voltage limit 45. As a result, the source controller 18 concludes that switch (S1) 3 and switch (S5) 24 can be turned back on and operation can continue.

In a second method, the rate of voltage decay during the sample period without a bias applied can be used to calculate the allowable minimum and allowable maximum rate of voltage decay during the next sample period with a bias applied. This next sample period with a bias applied will compare its rate of decay against these allowable minimum and allowable maximum values to determine if operation can continue. If operation can continue, this most recently measured rate of voltage decay with a bias applied can be used to calculate the allowable minimum and allowable maximum rate of voltage decay during the next sample period without a bias applied. This can continue in this alternating fashion to ensure that at no point does the source controller 18 set allowable limits with a fault already in place without it then being detected by the alternative bias usage.

The relationship between the limits with and without the bias applied [e.g., via the resistor(s) 12 and switch(es) 13] can be calculated using known electric-circuit-analysis techniques. In one example, where a resistor 12 is used as the bias, the circuit can be represented as an RC decay circuit, as is common in electrical engineering. This circuit exhibits a known relationship that relates the voltage across the combined equivalent line-to-line capacitance at a given time to the initial voltage across the combined equivalent line-to-line capacitance, the combined equivalent line-to-line resistance, and the combined equivalent line-to-line capacitance. The equivalent line-to-line capacitance includes capacitor 7, capacitor 9, and any other capacitance that might be in parallel. The equivalent line-to-line resistance includes resistor 8, resistor 6, and any other resistance that might be in parallel, such as a line-to-line fault resistance. This equation can be formed with and without the value of the known bias resistor 12 in parallel combination with the line-to-line capacitance, resulting in two equations with two unknowns—the combined equivalent line-to-line resistance excluding the bias resistor 12 and the combined equivalent line-to-line capacitance—where these two unknowns are to be solved by algebraic means. This set of two equations then allows algebraic manipulation to arrange this set of two equations for the desired terms that will be compared against limits for fault testing, such as the line-to-line resistance and capacitance. A key motivation in configuring these limits as a result of this algebraic manipulation will be to ensure that a range of resistances between zero and a specified upper threshold will be mathematically guaranteed to always exceed the configured limits for all values of capacitance above zero. Similar techniques can be applied to other forms of bias, such as a constant current source or a constant current sink. In this case, where the limits are reconfigured on a pulse-to-pulse basis, this bias can be reconfigured on a pulse-to-pulse basis as well to maximize signal quality. It would also be possible to reconfigure the bias within the same off-time to improve signal quality, to take all measurements needed to make an informed decision within the same off time, or both.

Figure 5:
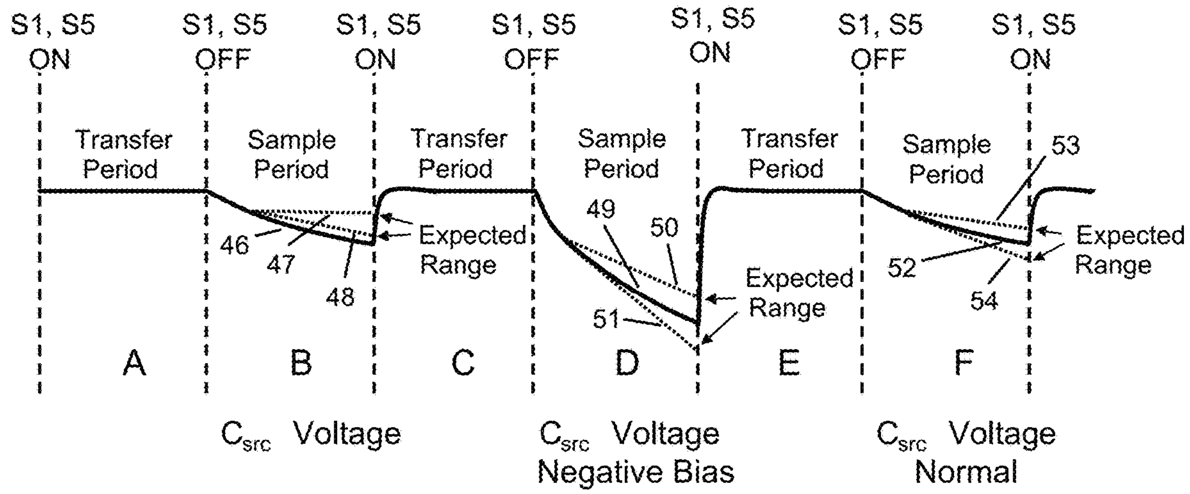
FIG. 5 illustrates PET waveforms where operation is able to adapt to use new limits without faulting out.

FIG. 5 shows an example of this second method where the limits are checked against a voltage-slope limit (volts per second) and where these limits are re-defined on a pulse-to-pulse basis. In sample period B, the source controller makes an initial guess for limits to use as an expected range for the slope, as shown with upper voltage-slope limit 47 and lower voltage-slope limit 48. In this example, the actual voltage slope 46 did not fall within the range. The source controller 18 permits switch (S1) 3 and switch (S5) 24 to turn back on to make a second check at a later time, which occurs in sample period D, where a negative bias is applied. By the time voltage slope 49 is checked, the source controller 18 uses the actual voltage slope 46 from sample period B to calculate the expected range for sample period D, given by upper voltage-slope limit 50 and lower voltage-slope limit 51. In this example, the actual voltage slope 49 falls within this expected range marked by 50 and 51. The source controller 18 turns switch (S1) 3 and switch (S5) 24 back on as a result and continues to another sample period F, where no bias is applied, similar to sample period B. By the time voltage slope 52 is checked, the source controller 18 uses the actual voltage slope 49 from sample period D to calculate the expected range for sample period F, given by upper voltage slope limit 53 and lower voltage slope limit 54. If there are no faults present, the signal is not significantly changed from sample period B, and the mathematical calculation of voltage-slope limits is correct, the source controller 18 will conclude that the actual voltage 52 is within the expected range marked by 53 and 54, and permit switch (S1) 3 and switch (S5) 24 to turn back on. As long as operating conditions and lack of faults persist, the operation will continue in the sequence shown with transfer period C, sample period D, transfer period E, and sample period F until stopped by user intervention or other means.

Figure 6:
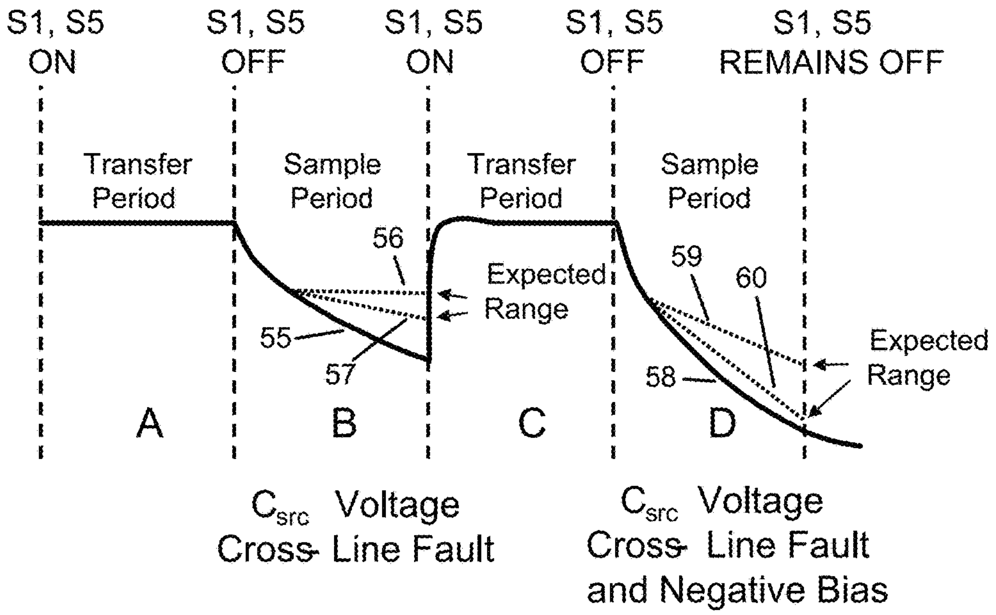
FIG. 6 illustrates PET waveforms where operation must cease when adaptation to new limits still results in a measurement outside of the expected range.

FIG. 6 shows the same approach as FIG. 5 but with a cross-line fault present. In FIG. 6, the sample period shows an initial check where the source controller 18 establishes an initial expected range, given by the upper voltage-slope limit 56 and lower voltage-slope limit 57, which could be the same as the upper voltage-slope limit 47 and lower voltage-slope limit 48 in FIG. 5, respectively. In this case, the actual voltage slope 55 is well below the lower voltage-slope limit 57 due to the presence of a cross-line fault. The source controller 18 turns switch (S1) 3 and switch (S5) 24 back on in order to verify the result in the subsequent check-in sample period D. By the time the voltage slope 58 is checked, the source controller 18 uses the actual voltage slope 55 from sample period B to calculate the expected range for sample period D, given by the upper voltage-slope limit 59 and the lower voltage-slope limit 60. In this example, due to the cross-line fault, the actual voltage slope 58 still falls outside the bounds of the expected range marked by the upper and lower voltage-slope limits 59 and 60. Since these limits 59 and 60 were calculated such that a minimum line-to-line resistance fault is always detected, this second failed check suggests to the source controller 18 that there may be a cross-line resistance fault, and the source controller 18 keeps power to the transmission lines 77 and 78 interrupted until the source controller 18 is allowed to check for the presence of the fault again, as prescribed by standards and other safety guidelines.

Variations that intermix elements from the first and second method can also be implemented. For example, the approach of using fixed sets of limits in the first method can be used in combination with reconfiguring these sets without turning off the voltage applied to the transmission lines 77 and 78, where a set provides an upper and lower limit for both the sample period without a bias and the sample period with a bias. When a set is reconfigured, all four limits would be reconfigured simultaneously and used for at least the next two sample periods unless the source controller 18 detects a fault prior. Anytime the source controller 18 detects a sample period outside of its bounds, it can set a flag to reconfigure the set of limits used at the next possible interval. If two out of the last three sample periods have a signal outside of its upper and lower bounds, the source controller 18 determines that there is a fault and will not turn back on until the fault has cleared. Ideally, the source controller 18 performs a calculation before reconfiguring the next set of limits to estimate the ideal set to use consistent with the calculation methods described in the second method. Alternatively, when the source controller 18 determines that a new set of limits is required, the source controller 18 can step through sets of limits in an orderly fashion, still abiding by the logic of turning off if two out of the last three sample periods are outside the permitted bounds.

In choosing between methods to implement, it is important to consider the operating voltage and possible fault currents. At higher voltages, longer transfer periods, or both, it may not be permissible to allow multiple pulses due to the risk of ventricular fibrillation (VF). In this case, the second method may not be a viable solution. In the case where these risks of VF are acceptably low, the second method may be given preference in order to improve uptime and reliability.

In a third method, the operating parameters can be automatically configured to optimize for one or more of the factors of safety, efficiency and resiliency in an always-safe sequence. When a limit is exceeded, the source controller 18 can configure new operating parameters either after ceasing operation due to a fault or while still operating, which may require new limits as well, depending on the implementation. With the new operating parameters, the measured signal is changed by either effecting a control or applying different measurement techniques to produce a new effect in the signal or improve the quality of the signal.

Figure 7:
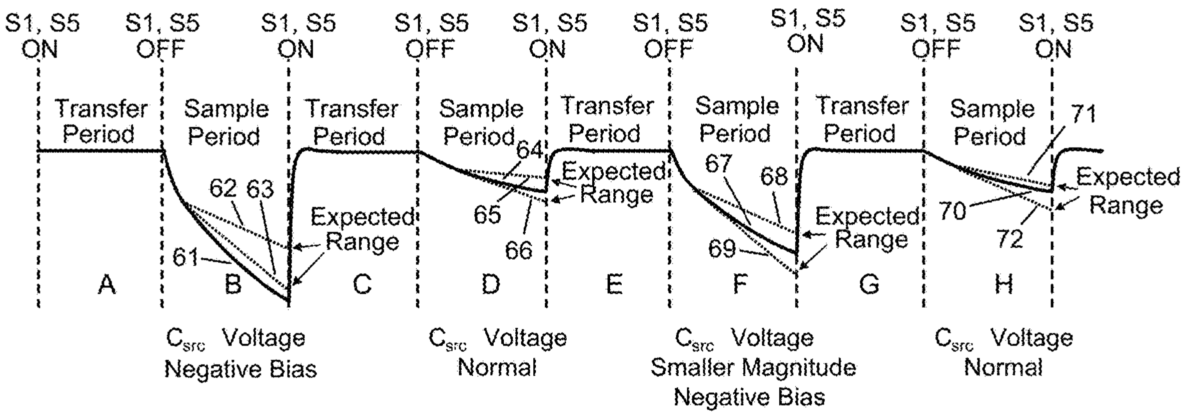
FIG. 7 illustrates PET waveforms where operation can be adapted by using a different bias without faulting out.

FIG. 7 shows an example where the magnitude of the bias can be adapted to optimize operation in an always-safe sequence without faulting out. In the first depicted sample period B, a negative bias is applied that results in the actual voltage slope 61 falling below the acceptable range established by the upper voltage-slope limit 62 and lower-voltage slope limit 63. This drop in the actual voltage slope 61 falling below the acceptable range may be due to a number of factors, such as the presence of a cross-line resistance fault or less cross-line capacitance than is expected. The source controller 18 turns switch (S1) 3 and switch (S5) 24 back on in order to verify the result in the subsequent check-in sample period D. Since the actual voltage slope 64 falls within the voltage-slope limits 65 and 66, the source controller 18 is able to determine that no critical cross-line resistance fault exists. The source controller 18 can use a smaller-magnitude bias in the subsequent sample period F. This smaller bias will result in a smaller voltage drop compared to sample period B, which offers the advantages of reducing current spikes for better electromagnetic compatibility, reliability, and efficiency, as well as providing further avoidance of a lower-voltage threshold that could result in cumulative effects on the heart that increase the risk of ventricular fibrillation. In sample period F, the smaller-magnitude bias results in the actual voltage slope 67 falling within the acceptable range of limits 68 and 69. This new bias magnitude triggers the calculation of new voltage-slope limits in order to proceed in an always-safe sequence and can be accomplished by reconfiguring the limits 68 and 69, limits 71 and 72, or both pairs of limits.

Figure 8:
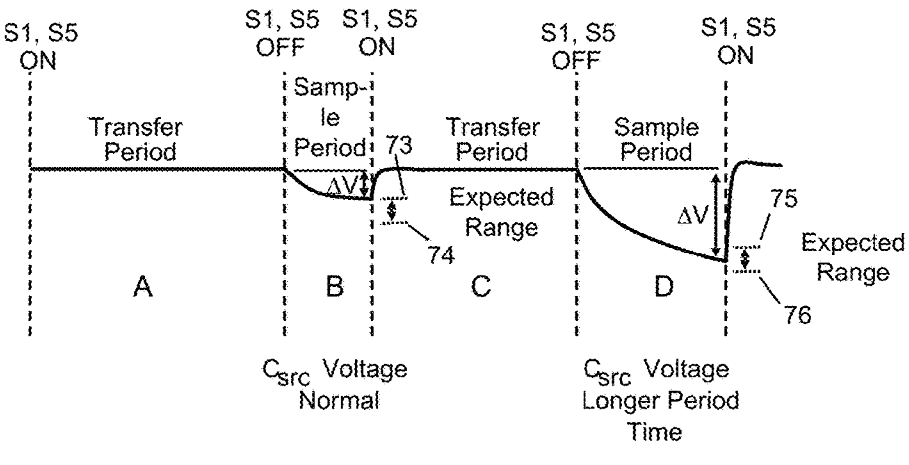
FIG. 8 illustrates PET waveforms where operation can be adapted by reconfiguring the duty cycle without faulting out.

FIG. 8 shows an example where the time duration of the sample period can be adapted in an always-safe sequence. In the first sample period B, the final voltage of the decay may fall outside of the expected range between limits 73 and 74. This may be due to a cross-line impedance fault, but it may be due to a poor signal-to-noise ratio, for example, that causes the signal to fall slightly outside of the small expected range. The source controller turns switch (S1) 3 and switch (S5) 24 back on and then performs a longer sample period in the subsequent sample period D. With a longer sample period, it is expected that there will be a larger change in voltage. This increase in the signal-to-noise ratio can allow for higher accuracy measurement and fault limit comparison to be done by the source controller to confirm whether there is truly a fault. If the final voltage falls within the expected range between limits 75 and 76, as shown in FIG. 8, the source controller can return to a shorter duration sample period again to increase efficiency among other system-performance parameters.

In both of these examples of adapting the magnitude of the bias and adapting the sample-period duration, these adaptations can be implemented such that the limits checked are not reconfigured. For example, instead of comparing voltage slopes or voltage magnitudes as the limits checked, the source controller can use the cross-line impedance for the limits checked. This cross-line impedance limit can be set to a limit that does not need to be altered under these operational changes. For example, based on data available on the impedance of the human body, the limit can be set such that all human bodies within a configured statistical distribution will fall within the range of detection. The limit, therefore, would not need to be reconfigured, but rather, the operational changes would be factored into the calculation from the measured values. A source controller that has sufficient support in the form of computational speed, computational accuracy, and other constraints commonly evaluated by a person skilled in the art during component selection can factor the new bias level or the new sample-period duration into its calculation of the measured cross-line impedance.

Summary, Ramifications and Scope

These same techniques can be applied to the load controller in the same way they apply to the source controller. For example, the load controller can make measurements of the operation of the transmission line and use the communication link 22 to indicate to the source controller whether digital-power transmission can continue.

These same techniques can be carried out by analyzing current instead of voltage. For example, the current draw through two different bias resistors during the off-time can be used to estimate line-to-line capacitance and other line-to-line resistance in the circuit to determine if there is a fault. These measurements, biases, or both can be scaled appropriately as smaller or larger line-to-line capacitance is estimated.

The initial guess at limits described in the second method can be set in several ways. An example of one way to make the initial guess is to set fixed defaults in the source controller via firmware or similar means. Another example is to set this initial guess based on some previous testing, such as from a previous operation or a startup mode. In this startup mode, voltages can be maintained at a safe level, or more time can be provided to react at a voltage level above this safe threshold but below the peak levels used during full operation. Given the increased time allowed, a calibration can be performed using techniques described herein or known to those skilled in the art in order to estimate, for example, the cross-line capacitance and resistance so that an initial guess of limits can be calculated.

In FIG. 5 and FIG. 6, the voltage-slope limits are depicted as linear slopes. Another way to set these limits may be curves and other non-linear functions for each of the upper and lower bounds. For example, an RC-decay equation is known to have a relationship between voltage and time that is an exponential decay. This function can be used to calculate upper and lower bounds.

In all methods of line-to-line resistance fault detection described, the rate of voltage decay can be compared directly against limits. In place of or in addition to direct comparison of the rate of voltage decay, the rate of voltage decay can be used to calculate a value indicative of the line-to-line impedance that includes resistance and capacitance, with limits applied to these impedance values.

In the case of line-to-line impedance fault detection, other known methods of measuring impedance can be used. For example, the carrier-wave change detection methods disclosed in Weiss '930 can be used to determine a line-to-line impedance. This could then be used to set limits and use automatic ranging methods described herein.

Reconfiguring of limits is described herein as an automatic operation performed by the processor. In this regard, unless otherwise stated, the terms "configuring" and "reconfiguring" may refer to conditional logic that loads a particular value from a particular memory location, but it may also refer to a non-conditional logic branch, such as when an initial default value is loaded.

Computer Implementation

The controllers 18 and 19 can be in the form of a computer, including a logic device, such as a microprocessor, microcontroller, programmable logic device or other suitable digital circuitry for executing the control algorithms; and the systems and methods of this disclosure can be implemented in a computing system environment. Examples of well-known computing system environments and components thereof that may be suitable for use with the systems and methods include, but are not limited to, personal computers, server computers, hand-held or laptop devices, tablet devices, smart phones, multiprocessor systems, microprocessor-based systems, set-top boxes, programmable consumer electronics, network PCs, minicomputers, mainframe computers, distributed computing environments that include any of the above systems or devices, and the like. Components of the logic device may include, but are not limited to, a computer processor, a computer-readable storage medium serving as memory, and a system bus that couples various system components, including the memory, to the computer processor.

The methods may be carried out via the computer processor accessing non-transitory computer-executable instructions, such as program modules, stored in the memory. Generally, program modules include routines, programs, objects, components, data structures, and so forth, that perform particular tasks or that implement particular types of data. The methods may also be practiced in distributed computing environments where tasks are performed by remote processing devices that are linked through a communications network.

In describing embodiments, herein, specific terminology is used for the sake of clarity. For the purpose of description, specific terms are intended to at least include technical and functional equivalents that operate in a similar manner to accomplish a similar result. Additionally, in some instances where a particular embodiment includes a plurality of system elements or method steps, those elements or steps may be replaced with a single element or step. Likewise, a single element or step may be replaced with a plurality of elements or steps that serve the same purpose. Further, where parameters for various properties or other values are specified herein for embodiments, those parameters or values can be adjusted up or down by $1/100^{th}$, $1/50^{th}$, $1/20^{th}$, $1/10^{th}$, $1/5^{th}$, $1/3^{rd}$, $1/2$, $2/3^{rd}$, $3/4^{th}$, $4/5^{th}$, $9/10^{th}$, $19/20^{th}$, $49/50^{th}$, $99/100^{th}$, etc. (or up by a factor of 1, 2, 3, 4, 5, 6, 8, 10, 20, 50, 100, etc.), or by rounded-off approximations thereof or within a range of the specified parameter up to or down to any of the variations specified above (e.g., for a specified parameter of 100 and a variation of $1/100^{th}$, the value of the parameter may be in a range from 0.99 to 1.01), unless otherwise specified. Further still, where methods are recited and where steps/stages are recited in a particular order—with or without sequenced prefacing characters added for ease of reference—the steps/stages are not to be interpreted as being temporally limited to the order in which they are recited unless otherwise specified or implied by the terms and phrasing.

This invention has been shown and described with references to particular embodiments thereof, those skilled in the art will understand that various substitutions and alterations in form and details may be made therein without departing from the scope of the invention. Further still, other aspects, functions, and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety for all purposes; and all appropriate combinations of embodiments, features, characterizations, and methods from these references and the present disclosure may be included in embodiments of this invention. Still further, the components and steps identified in the Background section are integral to this disclosure and can be used in conjunction with or substituted for components and steps described elsewhere in the disclosure within the scope of the invention.

I claim:

1. A method for determining an unknown resistance and an unknown capacitance, each connected across output terminals of a transmitter, the method comprising the steps of:

during a first sample period, obtaining values indicative of a first rate of voltage decay in a transmission line without a known bias applied;

during the first sample period or a second sample period, obtaining values indicative of a second rate of voltage decay with a single known bias applied; and calculating the unknown resistance and the unknown capacitance using the first rate of voltage decay, the second rate of voltage decay, and the single known bias.

2. The method of claim 1, where the rates of voltage decay are determined by an initial voltage and a subsequent voltage after a period of time.

3. The method of claim 1, where the rates of voltage decay are determined from numerical analysis that produces a polynomial function that approximates disturbance-free transmission line voltage measurements.

4. The method of claim 1, wherein integrity of the values indicative of the rates of voltage decay during line-voltage disturbances during at least the first sample period is ensured by:

acquiring at least three measurements of transmission-line voltage during at least the first sample period where voltage measurements may be affected by electrical disturbances;

performing numerical analysis on the voltage measurements to produce a polynomial function that approximates disturbance-free transmission-line voltage measurements;

estimating accuracy of the polynomial function based on magnitude of variance of individual voltage measurements from the approximation; and interrupting transmission of digital-electricity power over the transmission line if the estimated accuracy does not meet a minimum accuracy requirement.

5. The method of claim 1, wherein the single known bias is a resistor.

6. The method of claim 1, wherein all of the values are obtained within the first sample period.

7. The method of claim 1, wherein the unknown resistance includes line-to-line resistance that can be distinguished from known system resistances.

8. The method of claim 7, wherein the unknown resistance comprises a line-to-line fault.

9. The method of claim 1, wherein at least one receiver is connected to the transmission line.

10. The method of claim 9, wherein the method is performed in a digital-electricity power system.

11. The method of claim 1, further comprising:

comparing the unknown resistance or unknown capacitance is compared against a limit; and if the limit is exceeded, performing at least one of the following steps:

(a) de-energizing the transmission line;

(b) reconfiguring the limit; or (c) revising a set of operating parameters for packet energy transfer across the transmission line.

12. The method of claim 11, wherein the transmission line is de-energized, the method further comprising closing a source disconnect device to transmit electrical power from a power source through the transmission line if the unknown resistance or unknown capacitance falls within the limit.

13. A digital-electricity power system, comprising:

a transmitter configured to receive electrical power from a power source;

a receiver configured to receive the electrical power from the transmitter;

transmission lines electrically coupling the transmitter and the receiver to transmit the electrical power between the transmitter and the receiver;

a measurement apparatus configured to measure voltages in the digital electricity power system;

a single known bias source configured to supply an electrical bias to the transmission lines; and at least one controller configured to control the supply of the electrical bias to the transmission lines and to receive values indicative of a first rate of voltage decay in the transmission lines without the electrical bias applied to the transmission lines as well as values indicative of a second rate of voltage decay in the transmission lines with the electrical bias applied to the transmission lines, wherein the at least one controller is programmed to calculate unknown resistance and unknown capacitance using the first rate of voltage decay, the second rate of voltage decay; and the electrical bias applied by the single known bias source.

14. The digital-electricity power system of claim 13, wherein the rates of voltage decay are determined from numerical analysis that produces a polynomial function that approximates disturbance-free transmission line voltage measurements.

15. The digital-electricity power system of claim 13, wherein the single known bias source is a resistor.

* * * * *